(12) United States Patent
Storaska et al.

(10) Patent No.: US 8,183,949 B2
(45) Date of Patent: *May 22, 2012

(54) COMPENSATION OF VCO GAIN CURVE OFFSETS USING AUTO-CALIBRATION

(75) Inventors: Daniel W. Storaska, Walden, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

This patent is subject to a terminal disclaimer.

(21) Appl. No.: 12/365,919

(22) Filed: Feb. 5, 2009

(65) Prior Publication Data

US 2010/0194482 A1 Aug. 5, 2010

(51) Int. Cl.
*H04B 1/06* (2006.01)
(52) U.S. Cl. .............. 331/179; 331/16; 331/17
(58) Field of Classification Search ............... 331/16, 331/17, 179
See application file for complete search history.

(56) References Cited

U.S. PATENT DOCUMENTS

| | | | |
|---|---|---|---|
| 6,466,100 B2 | 10/2002 | Mullgrav, Jr. et al. | |
| 6,661,267 B2 | 12/2003 | Walker et al. | |
| 6,949,981 B2 | 9/2005 | Natonio et al. | |
| 7,142,623 B2 | 11/2006 | Sorna | |
| 7,269,402 B2 * | 9/2007 | Uozumi et al. | 455/255 |
| 2003/0050029 A1 | 3/2003 | Kaufmann et al. | |
| 2005/0062551 A1 | 3/2005 | Coppola et al. | |
| 2005/0137816 A1 | 6/2005 | Chuang et al. | |
| 2007/0205835 A1 * | 9/2007 | Iozsef et al. | 331/16 |

OTHER PUBLICATIONS

International Search Report dated Apr. 14, 2010.

* cited by examiner

*Primary Examiner* — James E Goodley
(74) *Attorney, Agent, or Firm* — Joseph Petrokaitis; Daryl K. Neff (57) ABSTRACT

A method is provided for selecting an operating band of a voltage-controlled oscillator ("VCO") of a phase locked loop ("PLL") for which the lock frequency is closest to a center of the frequency range of the operating band. In such method, steps can be performed to determine the maximum and minimum frequencies of the operating band and the center frequency between them. From the center frequency of the operating band and the lock frequency within such operating band, a difference value can then be determined. The operating bands of the PLL can be tested until an operating band having the smallest difference value is determined. The VCO can then be set to such operating band in order for the lock frequency to be closest to the center frequency of the operating band.

16 Claims, 4 Drawing Sheets

COMPENSATION OF VCO GAIN CURVE OFFSETS USING AUTO-CALIBRATION

BACKGROUND OF THE INVENTION

1. Technical Field

The present invention relates to oscillator circuits and related methods, especially phase locked loops with voltage controlled oscillators.

2. Description of Related Art

Phase-locked loops ("PLLs") which incorporate voltage-controlled oscillators ("VCOs") are used in a variety of applications, such as to perform channel selection and associated tuning in frequency-division multiplexed systems for radio, television, cable and satellite broadcast systems. In particular cases, the phase-locked loop may need to maintain the frequency output by a voltage-controlled oscillator ("VCO") for a very long period of time. In a serial data transmission system which can be implemented in an integrated circuit of a semiconductor element such as a chip, for example, transmission and receiving frequencies may need to remain locked over an entire operating lifetime of the chip.

Figure 1:
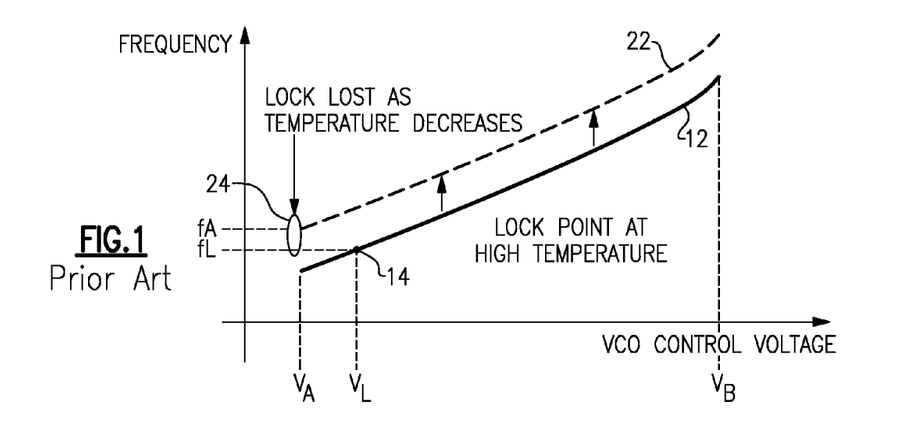
FIG. 1 is a diagram plotting an oscillation frequency of a voltage-controlled oscillator (VCO) as a function of a control voltage input thereto, for two different temperatures at which the VCO is operated.

Problems can cause prior art systems to have difficulty maintaining lock for such a long period of time. Operation of a PLL according to the prior art can be explained with reference to FIG. 1. As seen therein, a first curve 12 marked by a solid line plots a frequency output by a VCO versus a control voltage input to the VCO, the control voltage ranging between VA and VB. The first curve 12 indicates a sample result for a particular frequency band of operation, obtained when the chip incorporating the PLL is operated at relatively high temperature. As seen in FIG. 1, the point 14 at which the PLL locks the output frequency fL of the VCO under such condition results from a control voltage VL which is near the low end VA of the range VA-VB of the control voltage.

A problem arises when the temperature decreases. Curve 22 of FIG. 1 marked by a dashed line indicates a result that can occur when the temperature of the chip decreases from the temperature that was present earlier. At lower temperature, the operating curve 22 shifts upward, such that a control voltage input with a lower value is needed in order for the VCO to output and lock the same output frequency fL as before. However, unfortunately there is no control voltage value on the new operating curve 22 which results in the locked output frequency fL. The required output frequency fL is now too low a frequency to be produced by the VCO at the lower temperature. Point 24 on curve 22 results in a frequency fA which is higher than the required output frequency fL. Now, to be able to produce the required output frequency fL, the PLL must begin a coarse calibration process to test different frequency bands in order to select a new frequency band in which to operate. Such coarse calibration process can take considerable time away from normal operation of the chip. In integrated circuits used for data transmission, congestion or disruption of the flow of data communications can result when the PLL becomes unavailable temporarily in order to perform coarse calibration and re-establish the required output frequency.

Figure 2:
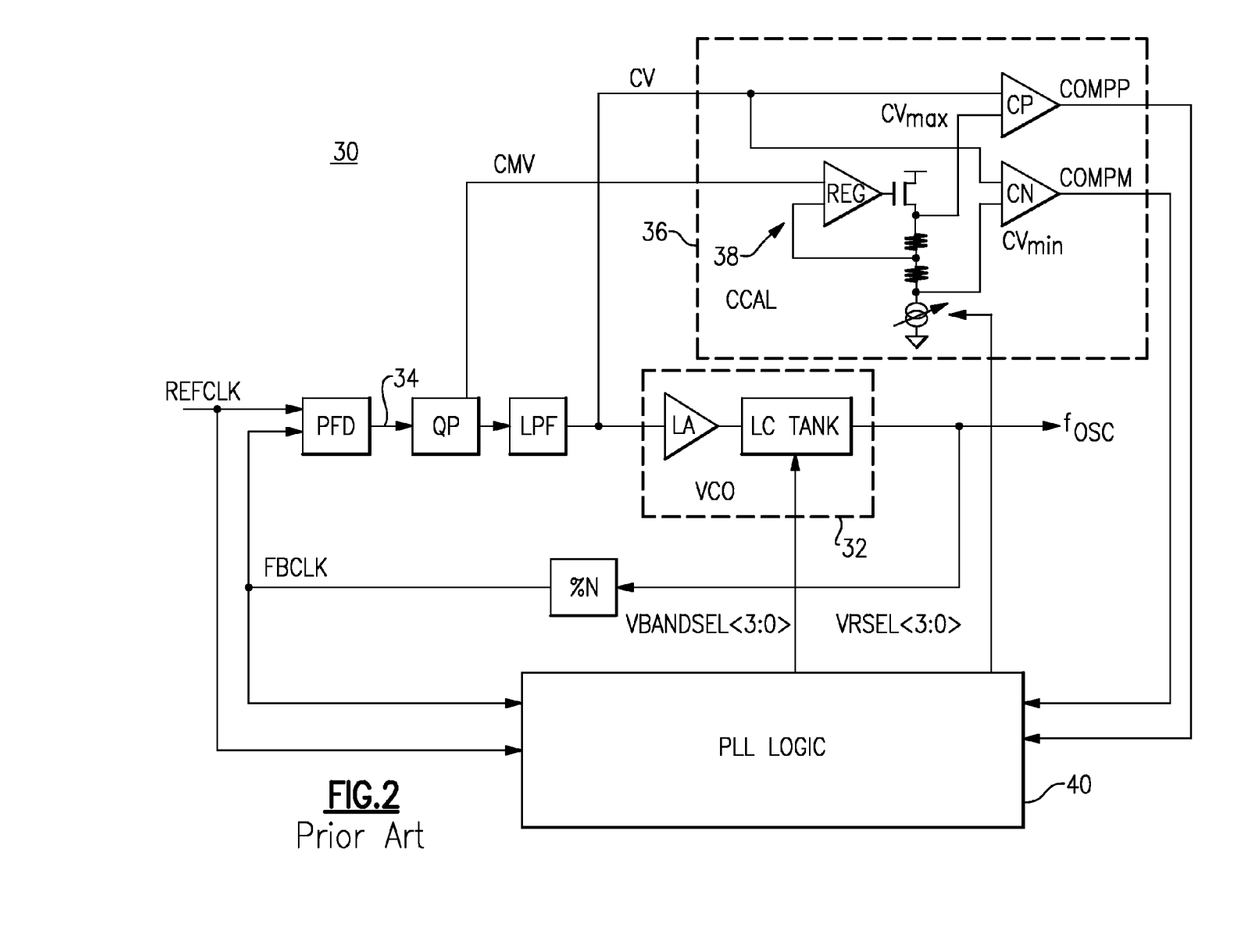
FIG. 2 is a block and schematic diagram illustrating a phase-locked loop ("PLL") in accordance with the prior art.

FIG. 2 is a block and schematic diagram illustrating a PLL 30 with coarse calibrating circuitry in accordance with the prior art. The VCO 32 includes a linear amplifier LA and a resonator including an LC tank circuit. A reference clock frequency (REFCLK) and a divider setting (% N) set the output frequency fL to be maintained by the VCO 32. In some applications such as for use in an intrasystem or inter-system serial data communications receiver, the PLL is expected to remain locked at a single output frequency fL over the entire lifetime of the PLL and the chip in which it is incorporated. In such case, the settings REFCLK and % N remain fixed throughout the lifetime of the chip. Viewed from left to right in FIG. 2, the PLL incorporates a phase-frequency discriminator PFD which produces an error signal 34 based on the difference between the frequencies of REFCLK and a feedback clock signal FBCLK obtained by dividing the output frequency fL with divider (% N). The error signal, typically in form of pulses, is input to a charge pump QP. The charge pump QP integrates the pulses and outputs a signal which is conditioned by a low-pass filter (LPF) to produce a control voltage CV at the input to the VCO 32. For coarse calibration, the charge pump QP produces a common mode voltage level CMV which is a neutral value of the control voltage.

The common mode voltage CMV and the control voltage CV are input to a coarse calibration circuit 36 which contains first and second comparators CN and CP and a circuit 38 to determine a minimum value CVmin and a maximum value CVmax that the control voltage can reach during operation of the PLL. The output COMPM of Comparator CN is activated when CV falls below CVmin. The output COMPP of Comparator CP is activated when CV rises above CVmax. During a coarse calibration operation, these signals COMPN and COMPP indicate whether the control voltage CV falls below the voltage CVmin, is between CVmin and CVmax, or rises above CVmax.

As further shown in FIG. 2, a PLL logic block 40 controls operation of the PLL by selecting the frequency band of the VCO operation through a band selection signal VBAND-SEL<3:0> provided to the LC Tank circuit. During coarse calibration, REFCLK and the % N inputs are established and maintained and the PLL logic 40 sets the LC Tank to a given frequency band, which may be the lowest frequency band for the PLL. The PLL then begins operating at a given control voltage CV, which can be at the low end of its range, i.e., at around CVmin. As the PLL then works to make FBCLK equal to REFCLK, the control voltage CV increases over time by operation of the phase frequency discriminator PFD and the charge pump QP. If COMPP becomes active, indicating that CV exceeds CVmax, the required output frequency fL is not found within the selected frequency band. The PLL logic then selects a different frequency band, typically the next higher frequency band, and then performs the foregoing actions again with such frequency band to determine if the required frequency fL can be attained and locked within that frequency band. On the other hand, if the required frequency fL is achieved and the current control voltage value is not beyond the low end CVmin or high end CVmax of its range, a lock point, i.e., the required output frequency, can be achieved within the currently selected frequency band of the PLL.

However, even when the lock point is detected to be within one of the operating frequency bands of the PLL, coarse calibration operation is not finished yet. The PLL illustrated in FIG. 2 is designed to determine the frequency band for which the final control voltage is nearest to the neutral level (the common mode voltage CMV). Thus, when such lock point is detected, the current value of the control voltage CV is saved by the PLL logic 40, as well as signals representing the current CVmax and CVmin values. After the lock point is detected in one operating frequency band, the PLL is switched to one or more other operating frequency bands and the foregoing actions are repeated to determine whether the lock point is achieved within such other operating frequency bands. When the lock point is detected, the current value of the control voltage CV is again saved by the PLL logic 40, as well as signals representing the current CVmax and CVmin values. When all the frequency bands have been determined in which the lock point is achieved, the PLL logic then selects an operating frequency band for which the lock point is closest to the center of the range between CVmin and CVmax for that operating frequency band. The PLL then begins operating with that selected frequency band and is intended to stay within that selected band.

Figure 3:
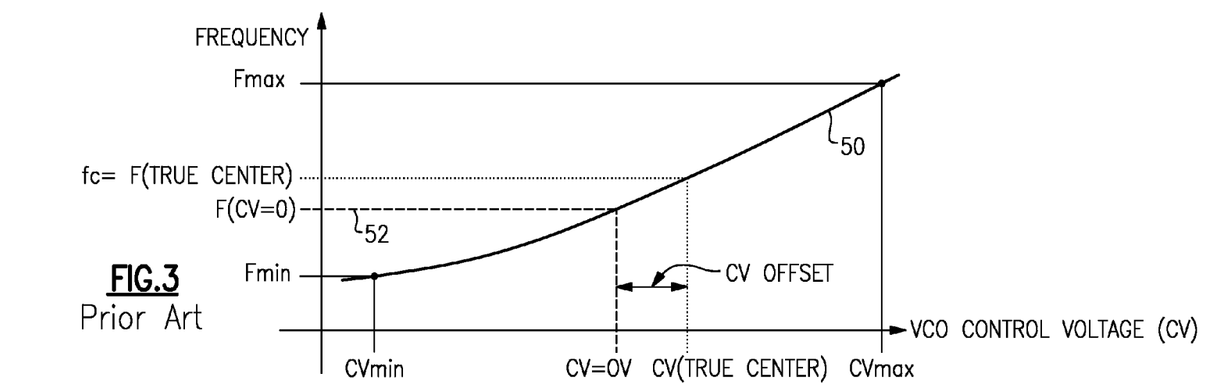
FIG. 3 is a diagram plotting an oscillation frequency versus control voltage characteristic of the prior art PLL (FIG. 3).

FIG. 3 is a graph illustrating an example of operation within one frequency band of the PLL described above with respect to FIG. 2. Here, the VCO control voltage CV is expressed as a difference from the common mode voltage CMV. In that case, CV having a value of 0V indicates that CV is equal to CMV. FIG. 3 demonstrates that even though lock is achieved when the control voltage CV is 0 V, lying closest to the center of its range CVmin-CVmax, the PLL 30 still may not be selecting the best frequency band of operation. Due to the nature to the nonlinear function of the LC Tank circuit 32 (FIG. 2), and offsets of the linear amplifier and other components of the PLL such as the coarse calibration circuitry 36, the control voltage CV=0 does not necessarily correspond to the center of the variable oscillation frequency band 50 of the VCO. The output frequency curve 50 shown in FIG. 3 rises more steeply on the right side of the figure than it is on the left. When the control voltage is relatively low, a given change in the control voltage produces a somewhat small change in the oscillation frequency. On the other hand, when the control voltage is relatively high, the oscillation frequency changes by a greater amount. Therefore, at the CV=0V point in FIG. 3, the control voltage is zero and at the center of the range CVmin-CVmax, but it does not result in the frequency fc which is the true center of the operating frequency band. Instead, when the control voltage is zero, the VCO has an output frequency 52 which is closer to the minimum frequency Fmin of the frequency band than it is to the maximum frequency Fmax. Therefore, the VCO output frequency cannot be driven down in frequency from the lock point as far as it can be driven up in frequency from the lock point.

SUMMARY OF THE INVENTION

In accordance with an aspect of the invention, a method is provided for selecting an operating band of a voltage-controlled oscillator ("VCO") of a phase locked loop ("PLL") for which the lock frequency is closest to a center of the frequency range of the operating band. In such method, steps can be performed to determine the maximum and minimum frequencies of the operating band and the center frequency between them. From the center frequency of the operating band and the lock frequency within such operating band, a difference value can then be determined. The operating bands of the PLL can be tested until an operating band having the smallest difference value is determined. The VCO can then be set to such operating band in order for the lock frequency to be closest to the center frequency of the operating band.

In accordance with another aspect of the invention, a method is provided for selecting an operating band of a plurality of operating bands of a phase locked loop ("PLL") which includes a voltage controlled oscillator ("VCO"), the operating band being selected for which a control voltage used to maintain lock at a selected output frequency of the VCO is closest to a center of its range. In such method, the VCO can be switched to a given operating band from among the plurality of operating bands of the VCO. The VCO can be caused to oscillate at a minimum output frequency for the given operating band and information be recorded which is representative of the minimum output frequency. The VCO can also be caused to oscillate at a maximum output frequency for the given operating band and information be recorded which is representative of the maximum output frequency. A center frequency of the given operating band can then be determined from the information representative of the minimum and maximum output frequencies. The PLL can be allowed to lock at a lock frequency when the lock frequency is within the given operating band. A current difference value can be determined as a difference between the center frequency and the lock frequency. The given operating band of the VCO can be switched to a next operating band from among the plurality of operating bands. The foregoing actions can be repeated so long as the current difference value obtained when the VCO is set to the given operating band is smaller than the lowest previous difference value obtained when the VCO was set to another operating band. In that way, an operating band can be selected for which the lock frequency is closest to the center frequency for the operating band.

In accordance with yet another aspect of the invention, a PLL is provided which includes a voltage controlled oscillator ("VCO") operable to acquire and maintain lock at a selected output frequency of the VCO. The PLL can further include control logic operable to perform steps in a method of selecting a frequency band for operating the VCO, the method being in accordance with one of the above-described aspects of the invention.

DETAILED DESCRIPTION

In accordance with an embodiment of the invention, a phase-locked loop ("PLL") is provided which is better able to maintain a selected tuning frequency in receivers which receive signals at a single carrier frequency for long periods of time. Such can be achieved despite variations in temperature, manufacturing variations, operating conditions and conditions of circuit elements which can cause the receiving frequency to drift somewhat away from an initially established lock frequency. In an embodiment of the invention, the PLL is capable of selecting a frequency band of operation for which the lock point is closest to the true center frequency of the band. In an embodiment of the invention, a PLL is provided which has relatively simple circuitry and a relatively simple method is provided for performing coarse calibration.

Figure 4:
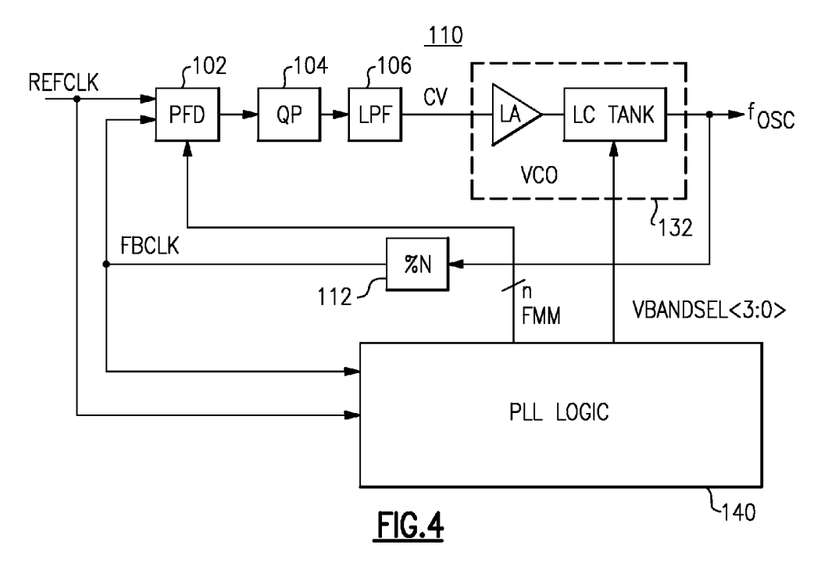
FIG. 4 is a block and schematic diagram illustrating a PLL in accordance with an embodiment of the invention.

The PLL and the circuits and methods described herein achieve benefits and advantages which will be apparent from the following description. FIG. 4 is a block and schematic diagram illustrating a PLL 110 in accordance with an embodiment of the invention. Components including the charge pump QP 104, low-pass filter LPF, VCO 132 and divider % N 112 are similar in structure and operation to the corresponding components of the PLL described above with reference to FIG. 2. The PLL 110 omits the coarse calibration circuit 36 of the prior art PLL (FIG. 2), as well as the regulator circuit 38 (FIG. 2) and the comparators COMPM and COMPP. The PLL contains a modified phase frequency discriminator PFD 102 and adds new control signals Max and Min for operating the PFD. The PFD 102 now includes a control interface which accepts a signal Min that forces the output of the PFD to the PFD's minimum output level. The PFD's control interface also accepts another signal Max that forces the output of the PFD to the PFD's maximum output level.

When the signal Min is asserted, the minimum PFD output level drives the control voltage CV at the input to the VCO 132 to its minimum level. As a result, the output frequency $f_{OSC}$ of the PLL 110 is driven to the minimum frequency Fmin for the selected frequency band of operation. When $f_{OSC}$ is at the minimum frequency, the PLL logic 140 stores a numerical value representative of that minimum frequency Fmin.

On the other hand, when the signal Max is asserted, the PFD is driven to its maximum output level, which in turn drives the control voltage CV to its maximum level. The output frequency $f_{OSC}$ of the PLL then is driven to the maximum frequency Fmax for the selected frequency band. When $f_{OSC}$ is at the maximum frequency, the PLL logic 140 stores a numerical value representative of that maximum frequency Fmax. From these numerical values, the true center frequency fc for the selected frequency band can then be determined as an average of the two values, i.e., fc=½(Fmax+Fmin).

The Max and Min signals can then be disabled and the PLL can be allowed to lock at the lock frequency fL. The PLL will lock as long as the lock frequency is within the currently selected frequency band. The PLL logic records a difference value representative of a difference between the band's center frequency fc and the lock frequency fL. A goal of the method can be to find the frequency band for which the difference between the center frequency fc and the lock frequency fL is the smallest. Therefore, the PLL logic then switches the VCO 132 to a next frequency band of operation and repeats the foregoing steps in order to determine the center frequency fc of that next frequency band and the difference between that center frequency and the lock frequency in that band. The process continues until the frequency band is identified which has the center frequency fc with the least difference from the lock frequency fL. The VCO then is operated using the identified frequency band. In so doing, the VCO is operated with a frequency band which can tolerate changes in temperature and other operating conditions or device properties without losing lock and having to re-calibrate to select another frequency band because of such changes.

Figure 5:
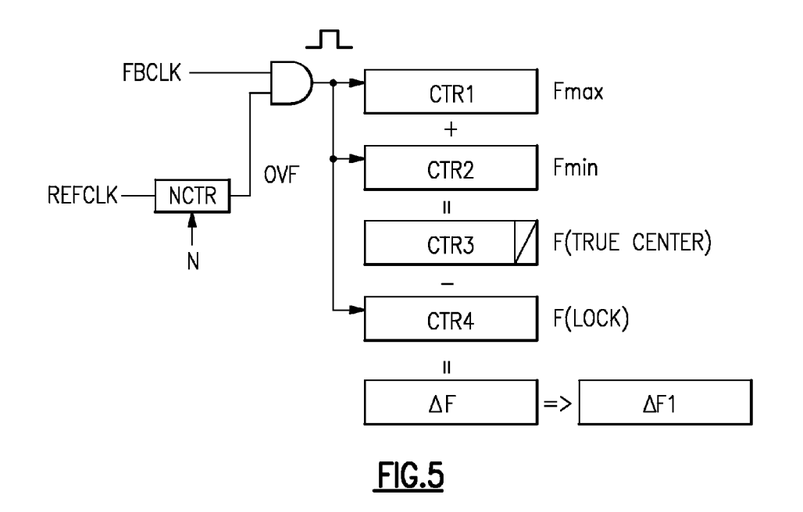
FIG. 5 is a schematic diagram illustrating operation of the PLL (FIG. 4) in accordance with an embodiment of the invention.

FIG. 5 is a diagram illustrating operations performed by the PLL logic 140 in accordance with a particular embodiment of the invention in determining the frequency band for which the difference Δf between fc and fL is the smallest. As depicted in FIG. 5, the reference frequency REFCLK is input to a counter NCTR which produces an overflow bit OVF each time NCTR reaches the maximum count. The OVF bit then is used to gate the FBCLK into the various counters by ANDing OVF with FBCLK. This technique produces a count representative of the frequency of FBCLK over N number of REFCLK cycles. The VCO is set to operate in a selected frequency band and the resulting pulses are input to a first counter CTR1 which counts the number of pulses in a period of time having a given length. When the Max signal is asserted at the input to the PFD, CTR1 counts the number of FBCLK pulses when $f_{OSC}$ is equal to Fmax over another period of time having the given length, and thus, produces a count value Fmax representative of the maximum output frequency for the frequency band. The same process then is repeated when the Min signal is asserted at the input to the PFD. At such time, CTR2 counts the number of FBCLK pulses when $f_{OSC}$ is equal to Fmin, and thus, produces a count value Fmin representative of the minimum output frequency for the frequency band.

To determine the true center frequency fc, the Fmin and Fmax count values stored in CTR1 and CTR2 then are added to form a total count value in CTR3 which is then divided by 2 by shifting each of the bits of the total count one position to the right in CTR3 to find the average of the two count values. While not asserting the Min and Max signals to the PFD, the PLL is allowed to reach the locking frequency and then determines a representative count value for the locking frequency fL by counting the FBCLK pulses via CTR4 when the PLL is locked over a period of time having the same (given) length.

A current difference value Δf=|fc−fL| is determined between the center frequency fc and the lock frequency fL. For later use, a difference value Δf1 is initialized with the current difference value Δf and saved. Another frequency band of operation, which can be the next higher frequency band, for example, then is selected for the VCO to operate. The above-described process then is repeated for the other frequency band to determine the difference value Δf for that frequency band. If the most recent Δf value is smaller than the saved difference value Δf1, then the most recent difference value Δf is saved as Δf1. The VCO is again set to another frequency band, such as the next higher frequency band, and the above-described process is again repeated for such frequency band. Again, it is determined whether the most recent difference value Δf is smaller than the saved difference value Δf1. If so, the current difference value Δf is saved as Δf1.

These steps are repeated at least until the current difference value Δf becomes larger than the saved difference value Δf1. When that is the case, the PLL logic sets the VCO to the frequency band which had the smallest difference value Δf. The frequency band with the smallest difference value Δf is usually the most recently tested frequency band prior to the current difference value Δf becoming greater than the saved difference value Δf1. The VCO then remains set at that frequency band during normal operation.

In a variation of the above-described embodiment (FIG. 5), a count value representative of a minimum oscillation frequency for the selected frequency band is obtained in a step prior to obtaining a count value representative of a maximum oscillation frequency. This variation of operation can be achieved easily by the control logic 140 supplying the Min signal to the PFD 102 and producing the count Fmin in a step prior to supplying the Max signal to the PFD 102 and producing the count Fmax.

In another variation of the embodiment described above (FIG. 5), the number of counters used to store and manipulate the counts can be reduced. Only one counter needs to be used to determine the count fc representing the center frequency as an average of the counts Fmax and Fmin. Therefore, in this variation, the counters CTR1, CTR2 and CTR3 shown in FIG. 5 would be replaced by a single counter CTRA which can be implemented as a register. In an example of operation, a frequency band is selected and the Fmax count is determined by operating the PLL at maximum frequency for that frequency band, by inputting the Max signal to the PFD and counting the number of pulses by CTRA in a period of time of given length. Then, the CTRA is stopped momentarily while the PLL is reset to operate at the minimum frequency for that frequency band by inputting the Min signal to the PFD. The CTRA then is allowed to count upwards again from the count (Fmax), at which it stopped earlier. This continues for another period of time of the same (given) length as before, such that CTRA now contains a count that represents the sum of Fmax and Fmin. Next, the value stored in CTRA, which represents the sum of Fmax and Fmin, is shifted one position to the right in CTRA, which effectively divides the value by two and results in the center frequency fc, which represents the average of the frequencies, i.e., ½(Fmax+Fmin).

Note that the counter representing the frequency fL which was stored in CTR4 above is actually the value of N. Thus, N can be subtracted from the value in CTRA to yield $\Delta f = |fc-fL|$ in CTRA. A second register can be used to save the $\Delta f1$ value for later comparisons, such register being reassigned with the current difference value $\Delta f$ whenever the current difference value is smaller than the saved difference value $\Delta f1$.

Figure 6:
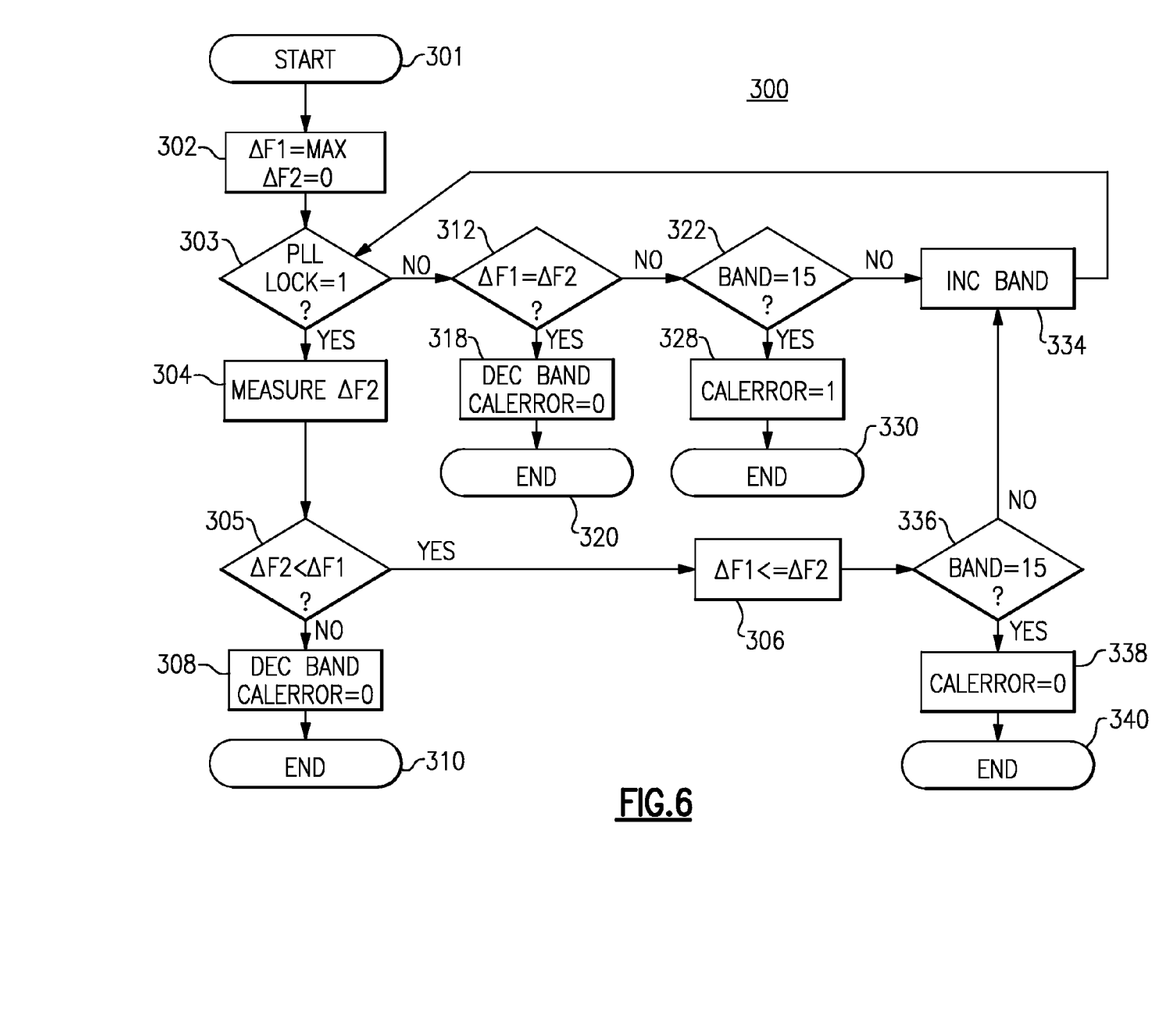
FIG. 6 is a flow diagram illustrating a method of calibrating the PLL (FIG. 4) in accordance with an embodiment of the invention.

Referring to FIG. 6, a method 300 in accordance with an embodiment of the invention will now be described for calibrating the PLL 110 (FIG. 4), i.e., for selecting a frequency band for operating the VCO. In the calibration method illustrated in FIG. 6, four possible endpoints 310, 320, 330 and 340 are shown. Endpoints 310, 320 and 340 represent success in determining a correct frequency band of operation, in that each endpoint 310, 320 and 340 is preceded by a determination that the calibration method is not in error, as indicated by the reference CALERROR=0 in blocks 308, 318 and 338. On the other hand, at endpoint 330 the method terminates on error as indicated by CALERROR=1 in block 328. For purposes of the following description, the PLL is assumed to have 16 frequency bands of operation numbered from 0 to 15. Of course, the PLL can have a greater number or smaller number of frequency bands without affecting the principles of operation of the herein-described method.

After starting operation (block 301), at block 302, the method begins by initializing the value of $\Delta f1$ to a maximum value, $\Delta f1$ being a value that will track the smallest detected difference in frequency between the center frequency and the lock frequency (fc−fL). Also, a value $\Delta f2$ is set to zero, such value representing the difference in frequency (fosc−fL) for the current frequency band of operation previously described as $\Delta f$. The PLL then is set to operate in the lowest frequency band, at which time the PLL scans through the frequency band, determines the true center frequency fc, such as by following the above-described method (FIG. 5) and determines the lock frequency fL, if any, within that frequency band. At block 303, if the PLL achieves lock within the frequency band, then the condition PLL Lock=1 is true, and operation now continues at block 304 in which the current difference value fc−fL is determined and is assigned to the value $\Delta f2$. Subsequently, in block 305 a determination is made whether $\Delta f2$ is less than $\Delta f1$. The first time this check is made, $\Delta f2$ must be less than $\Delta f1$ because $\Delta f1$ was initialized to the maximum value. In block 306, the current difference value of $\Delta f2$ is now assigned to $\Delta f1$ to used subsequently.

Next, at block 336, it is determined whether the highest frequency band (band 15) has been reached. If true, then the frequency band having the smallest difference value $\Delta f2$ must have already been found. Therefore, the calibration method ends successfully (CALERROR=0) (block 338) and the method terminates (block 340). However, when the highest frequency band has not been reached, operation continues by selecting the next higher frequency band of operation (INC Band), as indicated at block 334. The center frequency fc and the lock frequency fL for the next band are then determined again in a manner as previously described.

At block 303, if the PLL is able to achieve lock within that frequency band, the current difference value $\Delta f2$ is determined (block 304) and again it is determined whether the current difference value $\Delta f2$ is less than the previously saved difference value $\Delta f1$ (block 305). If the current difference value $\Delta f2$ is not smaller than the saved difference value $\Delta f1$, then it is determined that the frequency band having the smallest difference value has already been found. Here, the frequency band selection is returned to the most recent previous value, i.e., the frequency band immediately below the currently selected frequency band, as indicated by the words "Dec Band" in block 308. The method is indicated to be successful (CALERROR=0) in block 308 and the method then terminates (block 310).

Block 312 is reached when the PLL is unable to achieve lock within the selected frequency band. Here, a check is made to determine whether $\Delta f1$ is equal to $\Delta f2$. If the values are equal, then it is determined that the frequency band having the smallest difference value has already been found. The frequency band selection is returned to the most recent previous value, i.e., the frequency band immediately below the currently selected frequency band, as indicated by the words "Dec Band" in block 318. The method is indicated to be successful (CALERROR=0) in block 318 and the method then terminates (block 320).

When $\Delta f1$ is not equal to $\Delta f2$, at block 322 a check is then made whether the highest frequency band (Band=15) has been reached. When that is true, this indicates that a frequency band has not yet been determined in which lock was achieved (block 328). Therefore, it is clear that the calibration method has resulted in error (CALERROR=1) and the method then terminates (block 330).

However, when it is determined at block 322 that the highest frequency band has not yet been reached, operation then continues at block 334. The PLL is set to the next higher frequency band and operation continues at block 303, as described above, until the frequency band is determined for which the smallest difference value is obtained between the center frequency fc and the lock frequency fL.

While the invention has been described in accordance with certain preferred embodiments thereof, many modifications and enhancements can be made thereto without departing from the true scope and spirit of the invention, which is limited only by the claims appended below.

What is claimed is:

1. A method of operating a phase locked loop ("PLL") including a voltage controlled oscillator ("VCO"), comprising:
   a) switching the VCO to an operating band selected from among the plurality of operating bands of the VCO;
   b) causing the VCO to oscillate at a minimum output frequency for the selected operating band by supplying a control voltage at a minimum level thereto and counting pulses in feedback from the minimum output frequency during a first time interval;
   c) causing the VCO to oscillate at a maximum output frequency for the selected operating band by supplying a control voltage at a maximum level thereto and counting pulses in feedback from the maximum output frequency during a second time interval;

d) determining a true center frequency of the selected operating band from the count of the pulses during the first and second time intervals;

e) allowing the PLL to lock the output frequency at a lock frequency when the lock frequency is within the selected operating band and measuring the lock frequency by counting pulses in feedback from the lock frequency;

f) storing a current difference value determined as a difference between the true center frequency of the selected operating band and the measured lock frequency; and g) switching the VCO to another operating band selected from among the plurality of operating bands; and h) repeating steps (b) through (g) so long as the current difference value obtained when the VCO is set to the selected operating band is smaller than the lowest previously obtained difference value obtained when the VCO was previously set to another operating band, so as to select the operating band for which the measured lock frequency is closest to the true center of the frequency range of the selected operating band, such that the method is capable of setting the VCO to the operating band for which the measured lock frequency is closest to the true center of the frequency range of any of the operating bands, even if the output frequency of the VCO is a nonlinear function of the control voltage.

2. A method as claimed in claim 1, wherein in step (b) the VCO is caused to oscillate at the minimum output frequency by forcing a phase discriminator of the PLL to a minimum output level to generate the control voltage at the minimum level and in step (c) the VCO is caused to oscillate at the maximum output frequency by forcing the phase discriminator of the PLL to a maximum output level to generate the control voltage at the maximum level.

3. A method as claimed in claim 1, further comprising recording the count of the pulses in steps (b) and (c) in a first counter.

4. A method as claimed in claim 1, wherein the pulses are counted during step (b) by incrementing the first counter and stopping the first counter at a first count when the first time interval ends and the pulses are counted during step (c) by incrementing the first counter from the first count and stopping the first counter at a second count when the second time interval ends.

5. A method as claimed in claim 4, wherein step (d) is performed by obtaining an average of the minimum and maximum output frequencies of the VCO by halving the second count in the counter.

6. A method as claimed in claim 1, wherein the VCO includes a tank circuit including an inductor and a capacitor for causing the VCO to oscillate.

7. A method as claimed in claim 1, wherein the output frequency of the VCO is a nonlinear function of the control voltage input to the VCO.

8. A method as claimed in claim 1, further comprising:
(i) operating the PLL in the locked condition with the VCO set to the operating band having the smallest difference value, such that the PLL is best able to maintain the locked condition over the operating lifetime of an apparatus in which the PLL is incorporated, notwithstanding variation in at least one of temperature, operating condition and a condition of a device of said PLL.

9. A phase locked loop ("PLL"), comprising:
a voltage controlled oscillator ("VCO") operable to acquire and maintain lock at a selected output frequency of the VCO; and
control logic operable to perform steps in a method of selecting a frequency band for operating the VCO, the method including:

a) switching the VCO to an operating band selected from among the plurality of operating bands of the VCO;

b) causing the VCO to oscillate at a minimum output frequency for the selected operating band by supplying a control voltage at a minimum level thereto and counting pulses in feedback from the minimum output frequency during a first time interval;

c) causing the VCO to oscillate at a maximum output frequency for the selected operating band by supplying a control voltage at a maximum level thereto and counting pulses in feedback from the maximum output frequency during a second time interval;

d) determining a true center frequency of the selected operating band from the count of the pulses during the first and second time intervals;

e) allowing the PLL to lock the output frequency at a lock frequency when the lock frequency is within the selected operating band and measuring the lock frequency by counting pulses in feedback from the lock frequency;

f) storing a current difference value determined as a difference between the true center frequency of the selected operating band and the measured lock frequency; and g) switching the VCO to another operating band selected from among the plurality of operating bands; and h) repeating steps (b) through (g) so long as the current difference value obtained when the VCO is set to the selected operating band is smaller than the lowest previously obtained difference value obtained when the VCO was previously set to another operating band, so as to set the VCO to the operating band for which the measured lock frequency is closest to the true center of the frequency range of the selected operating band, such that the PLL is capable of setting the VCO to the operating band for which the measured lock frequency is closest to the true center of the frequency range of any of the operating bands, even if the output frequency of the VCO is a nonlinear function of the control voltage.

10. A PLL as claimed in claim 9, wherein in step (b) of the method the VCO is caused to oscillate at the minimum output frequency by forcing a phase discriminator of the PLL to a minimum output level to generate the control voltage at the minimum level and in step (c) of the method the VCO is caused to oscillate at the maximum output frequency by forcing the phase discriminator of the PLL to a maximum output level to generate the control voltage at the maximum level.

11. A PLL as claimed in claim 9, wherein the method further comprises recording the count of the pulses in steps (b) and (c) in a first counter.

12. A PLL as claimed in claim 11, wherein the control logic is operable to cause the pulses to be counted during step (b) of the method by incrementing the first counter and stopping the first counter at a first count when the first time interval ends and to cause the pulses to be counted during step (c) by incrementing the first counter from the first count and stopping the first counter at a second count when the second time interval ends.

13. A PLL as claimed in claim 12, wherein the control logic is operable to cause step (d) of the method to be performed by obtaining an average of the measurements of the minimum and maximum output frequencies of the VCO by halving the second count in the counter.

14. A PLL as claimed in claim 9, wherein the VCO includes a tank circuit including an inductor and a capacitor for causing the VCO to oscillate.

15. A PLL as claimed in claim 9, wherein the output frequency of the VCO is a nonlinear function of the control voltage input to the VCO.

16. A PLL as claimed in claim 9, wherein the method further comprises:
　i) operating the PLL in the locked condition with the VCO set to the operating band having the smallest difference value, such that the PLL is best able to maintain the locked condition over the operating lifetime of an apparatus in which the PLL is incorporated, notwithstanding variation in at least one of temperature, operating condition and a condition of a device of said PLL.

\* \* \* \* \*